United States Patent
Ha et al.

(10) Patent No.: US 12,400,886 B2
(45) Date of Patent: *Aug. 26, 2025

(54) APPARATUS FOR TRANSPORTING SUBSTRATE AND SYSTEM FOR TREATING SUBSTRATE WITH THE APPARATUS

(71) Applicant: SEMES CO., LTD., Chungcheongnam-do (KR)

(72) Inventors: Sun Ho Ha, Gyeongsangnam-do (KR); Duk Hyun Son, Chungcheongnam-do (KR)

(73) Assignee: SEMES CO., LTD, Chungcheongnam-Do (KR)

( * ) Notice: Subject to any disclaimer, the term of this patent is extended or adjusted under 35 U.S.C. 154(b) by 337 days.

This patent is subject to a terminal disclaimer.

(21) Appl. No.: 18/088,986

(22) Filed: Dec. 27, 2022

(65) Prior Publication Data

US 2023/0130873 A1    Apr. 27, 2023

Related U.S. Application Data

(63) Continuation of application No. 17/148,914, filed on Jan. 14, 2021, now Pat. No. 11,569,103.

(30) Foreign Application Priority Data

Jan. 15, 2020    (KR) .................. 10-2020-0005548

(51) Int. Cl.
*B25J 19/00*    (2006.01)
*B65G 47/90*    (2006.01)
(Continued)

(52) U.S. Cl.
CPC ........ *H01L 21/67196* (2013.01); *B65G 47/90* (2013.01); *B65G 69/20* (2013.01); *H01L 21/67748* (2013.01); *B25J 19/0054* (2013.01)

(58) Field of Classification Search
CPC ........ H01L 21/67196; H01L 21/67748; B65G 47/90; B65G 69/20; B25J 19/0054
See application file for complete search history.

(56) References Cited

U.S. PATENT DOCUMENTS 6,298,684 B1    10/2001    Mitsuyoshi
7,601,934 B2    10/2009    Quach et al.
(Continued)

FOREIGN PATENT DOCUMENTS

JP    2001035902 A    2/2001
JP    2001126970 A    5/2001
(Continued)

OTHER PUBLICATIONS

Chinese Office Action for Chinese Application No. 202011536417.1, dated Sep. 21, 2023, 9 pages.
(Continued)

*Primary Examiner* — Ronald P Jarrett
(74) *Attorney, Agent, or Firm* — Buchanan Ingersoll & Rooney PC

(57) ABSTRACT

Provided are a substrate transporting apparatus capable of preventing an increase in temperature of a transporting robot by installing a cooling plate around the transporting robot, and a substrate treating system including the same. The substrate transporting apparatus includes a transporting unit for transporting a substrate; and a cooling plate for controlling a temperature of the transporting unit, wherein the cooling plate is spaced apart from a side surface of the transporting unit and installed as a side wall, or is installed in close contact with the side surface of the transporting unit.

10 Claims, 11 Drawing Sheets

(51) Int. Cl.
  *B65G 69/20* (2006.01)
  *H01L 21/67* (2006.01)
  *H01L 21/677* (2006.01)

(56) References Cited

U.S. PATENT DOCUMENTS

| | | | |
|---|---|---|---|
| 7,942,622 | B2 | 5/2011 | Kondoh et al. |
| 8,156,840 | B2 | 4/2012 | Tange |
| 8,740,535 | B2 | 6/2014 | Kondoh et al. |
| 9,082,800 | B2 | 7/2015 | Enokida et al. |
| 9,327,918 | B2 | 5/2016 | Hayashi et al. |
| 10,265,868 | B2 | 4/2019 | Kurita et al. |
| 10,395,956 | B2 | 8/2019 | Yoshida et al. |
| 2003/0198551 | A1* | 10/2003 | Schmidt ............ H01L 21/67259 414/749.1 |
| 2008/0023656 | A1 | 1/2008 | Quach et al. |
| 2011/0232538 | A1 | 9/2011 | Chou |
| 2012/0034570 | A1 | 2/2012 | Yasui et al. |
| 2017/0303440 | A1 | 10/2017 | Shimasaki |
| 2021/0167443 | A1 | 6/2021 | Ogino et al. |

FOREIGN PATENT DOCUMENTS

| | | | |
|---|---|---|---|
| JP | 2002156195 A | 5/2002 |
| JP | 5885404 B2 | 3/2016 |
| KR | 20050119872 A | 12/2005 |
| KR | 20080046517 A | 5/2008 |
| KR | 10-2008-0074123 A | 8/2008 |
| KR | 20080091445 A | 10/2008 |
| KR | 100874951 B1 | 12/2008 |
| KR | 20130032274 A | 4/2013 |
| KR | 20160017391 A | 2/2016 |
| KR | 20170067240 A | 6/2017 |
| KR | 20180049187 A | 5/2018 |
| KR | 20180077681 A | 7/2018 |
| KR | 20180127388 A | 11/2018 |
| KR | 20180127762 A | 11/2018 |
| KR | 20210023686 A | 3/2021 |

OTHER PUBLICATIONS

Korean Written Decision on Registration issued Dec. 25, 2023, by the Korean Intellectual Property Office in corresponding Korean Patent Application No. 10-2022-0162702 with translation (7 pages).
Korean Notification of Reason for Refusal for Korean Application No. 10-2020-0005548, dated Oct. 26, 2021 with translation, 14 pages.
Korean Office Action for Korean Application No. 10-2020-0005548, dated Mar. 29, 2021, 6 pages.
Korean Request for Submission of an Opinion for Korean Application No. 10-2020-0005548, dated Jun. 7, 2022, with translation, 14 pages.
Korean Written Decision on Registration for Korean Application No. 10-2020-0005548, dated Sep. 1, 2022, with translation, 4 pages.
Entire patent prosecution history of U.S. Appl. No. 17/148,914, filed Jan. 14, 2021, entitled, "Apparatus for Transporting Substrate and System for Treating Substrate With the Apparatus."

\* cited by examiner

[FIG. 1]
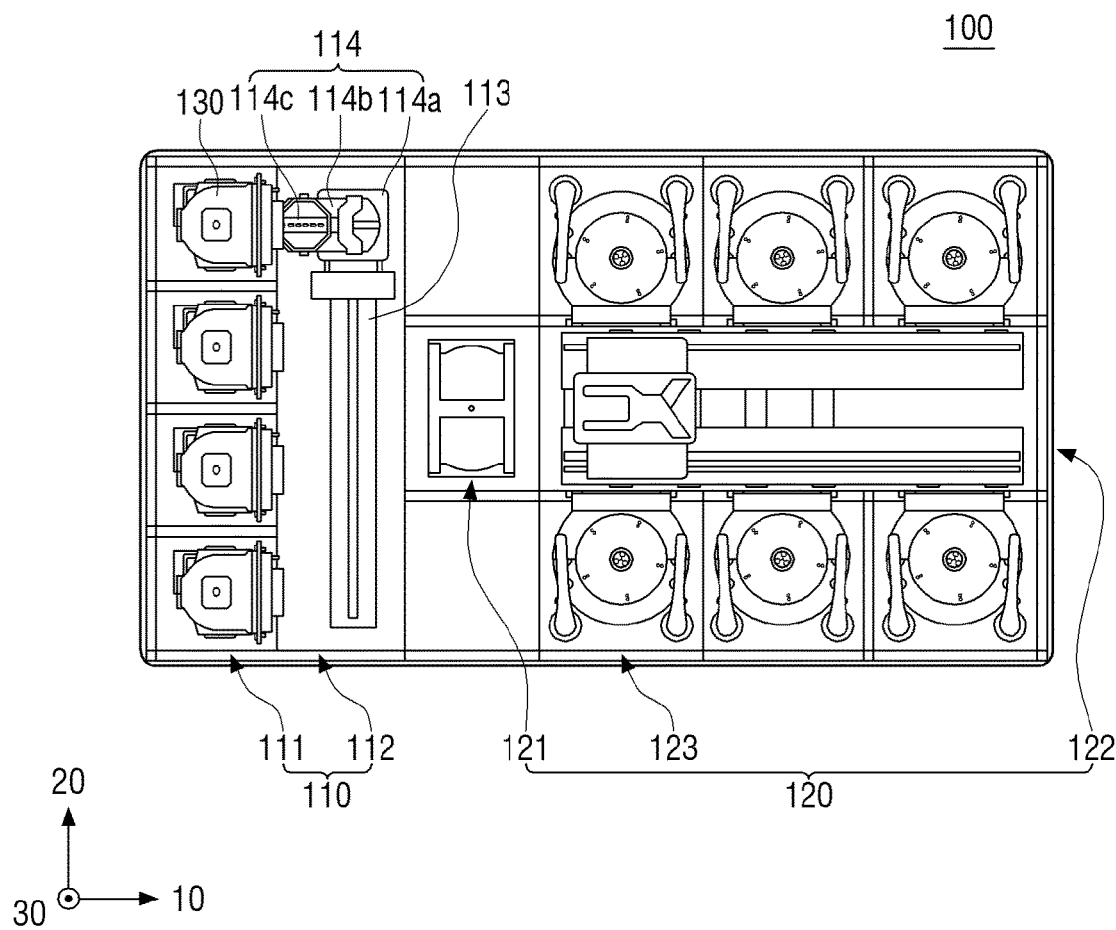

[FIG. 2]
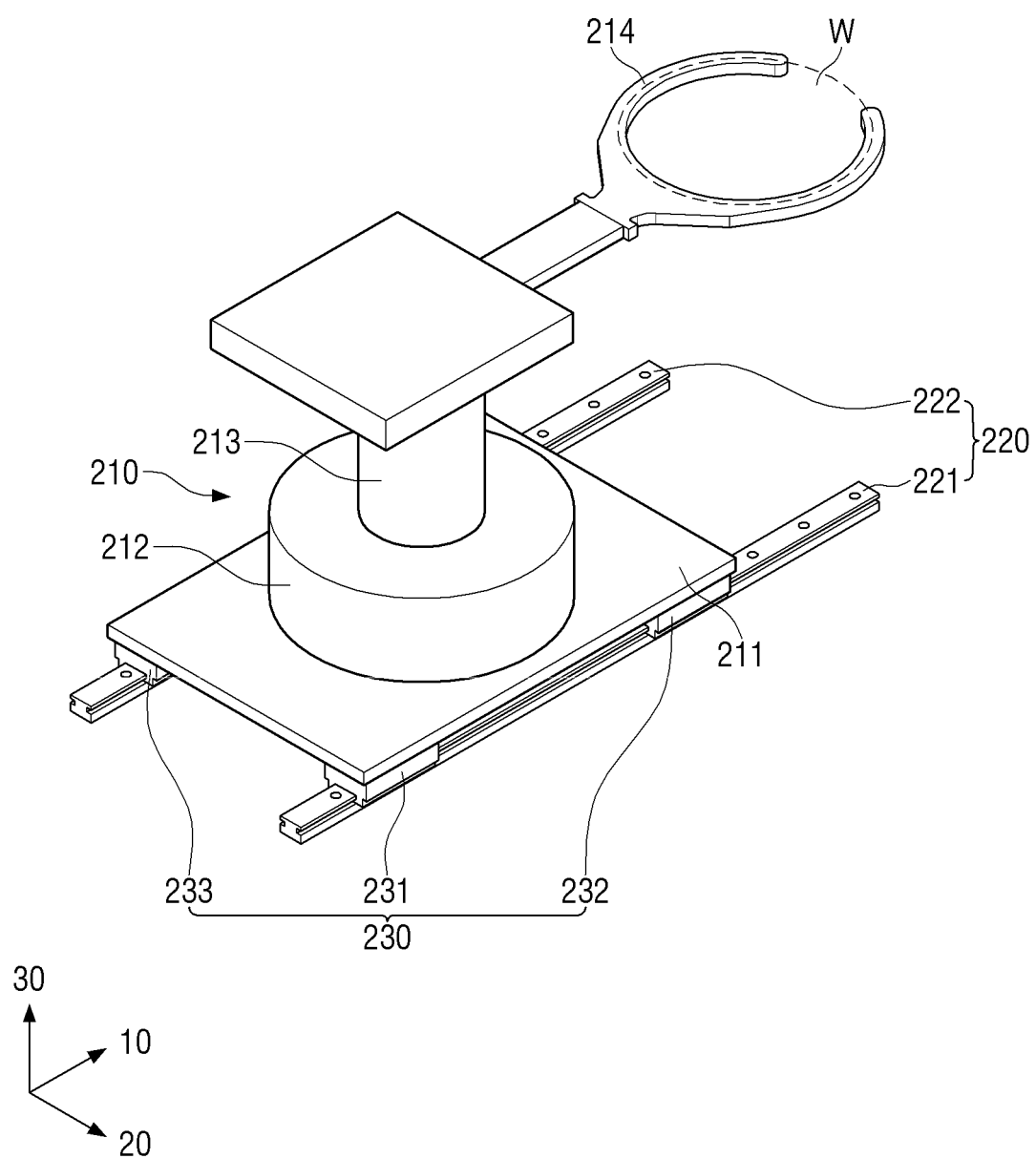

[FIG. 3]
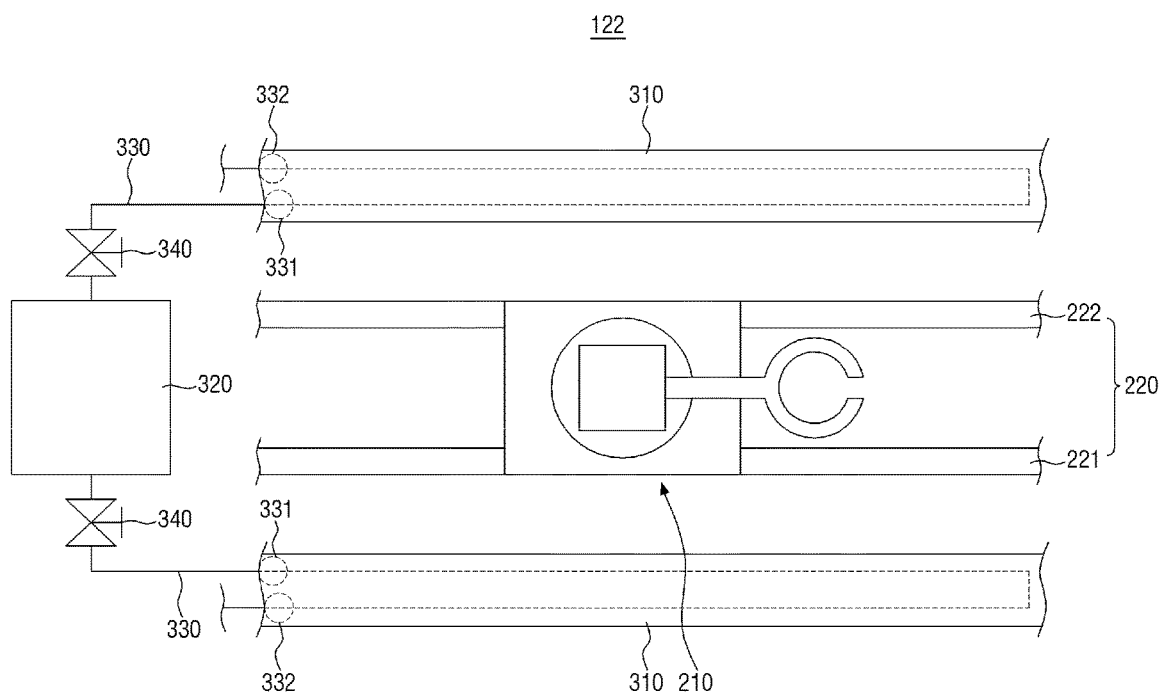

[FIG. 4]
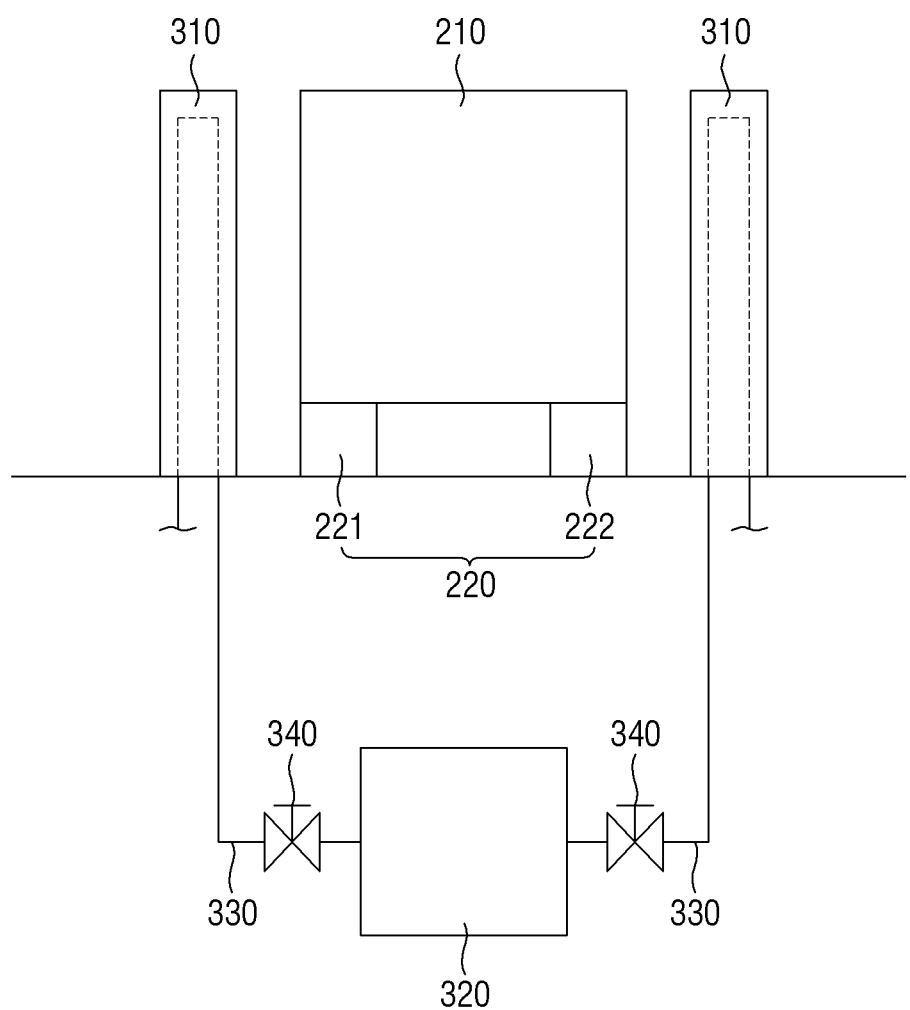

[FIG. 5]
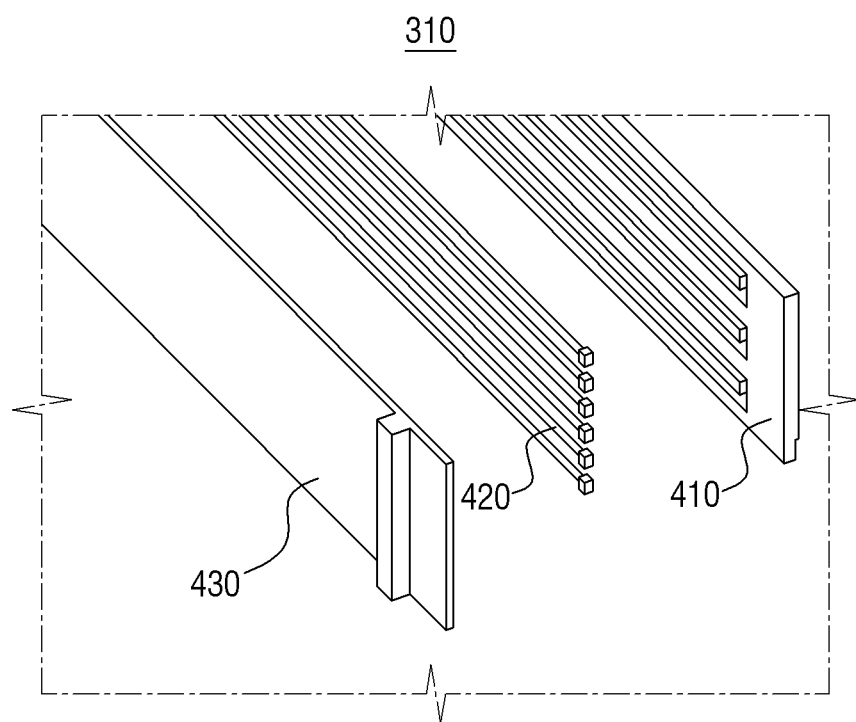

[FIG. 6]
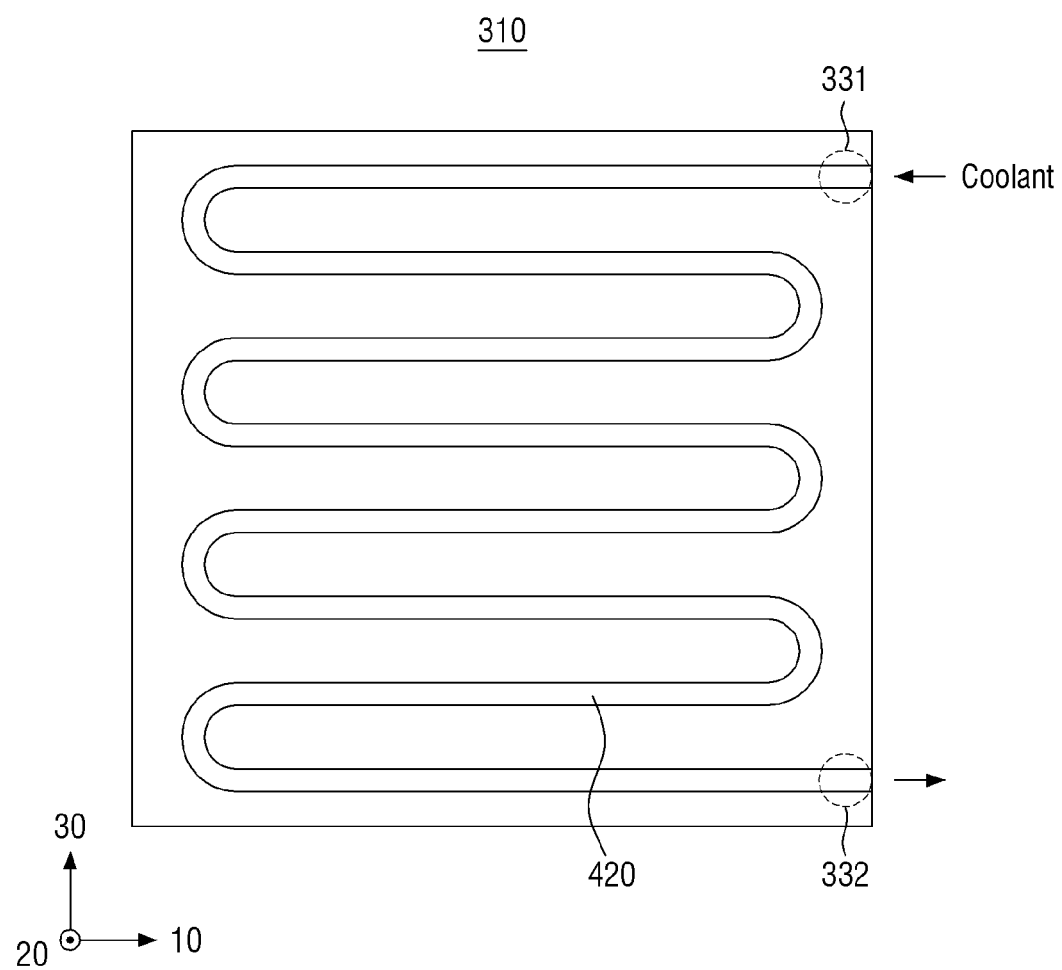

[FIG. 7]
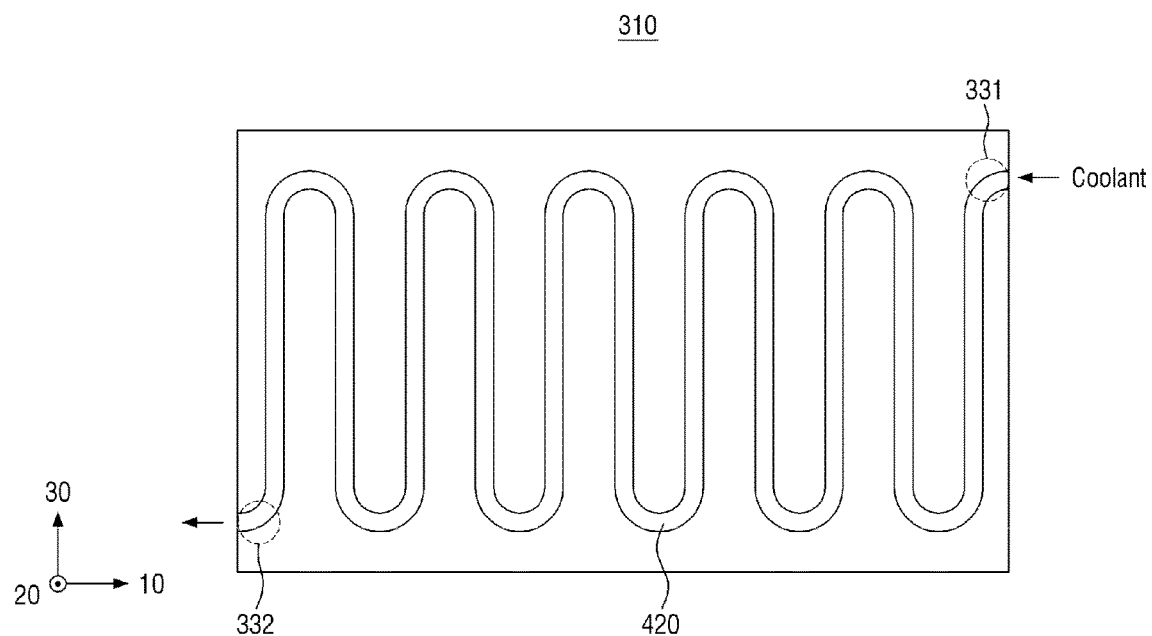

[FIG. 8]
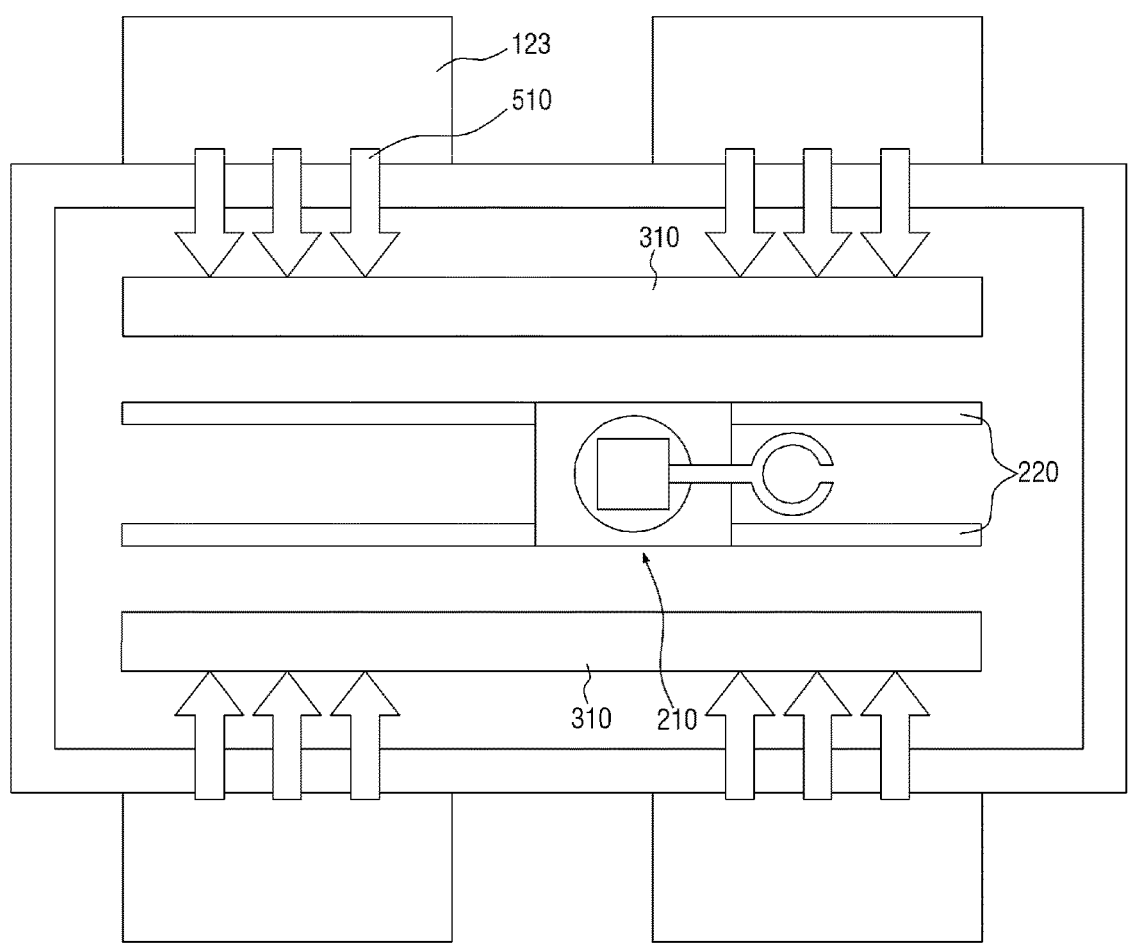

[FIG. 9]
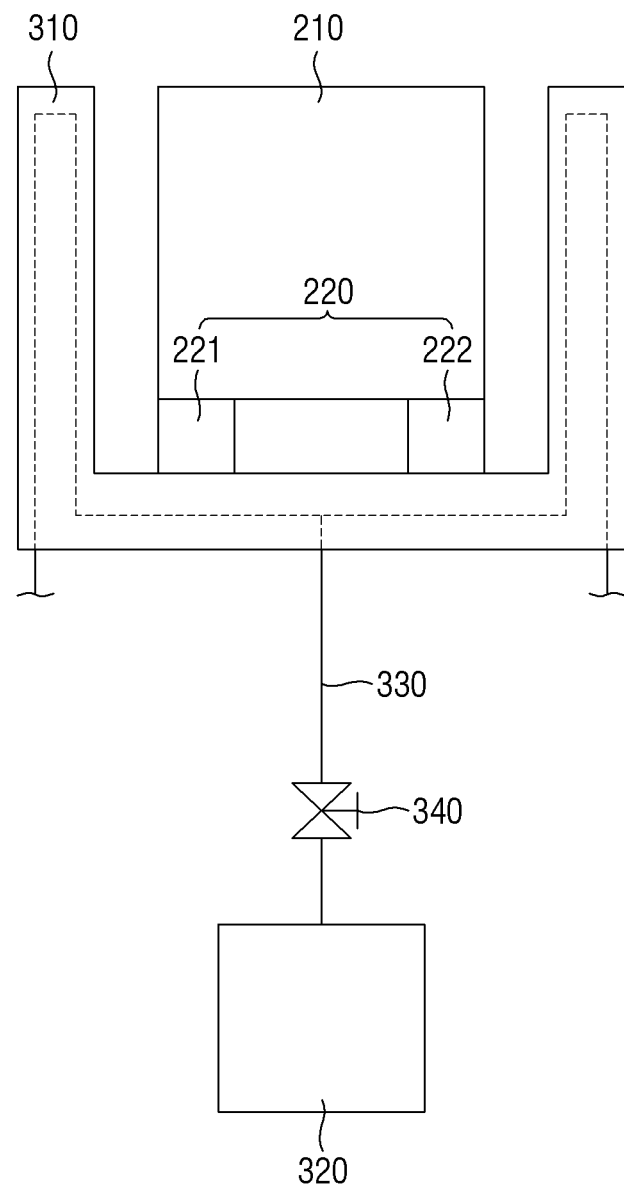

[FIG. 10]
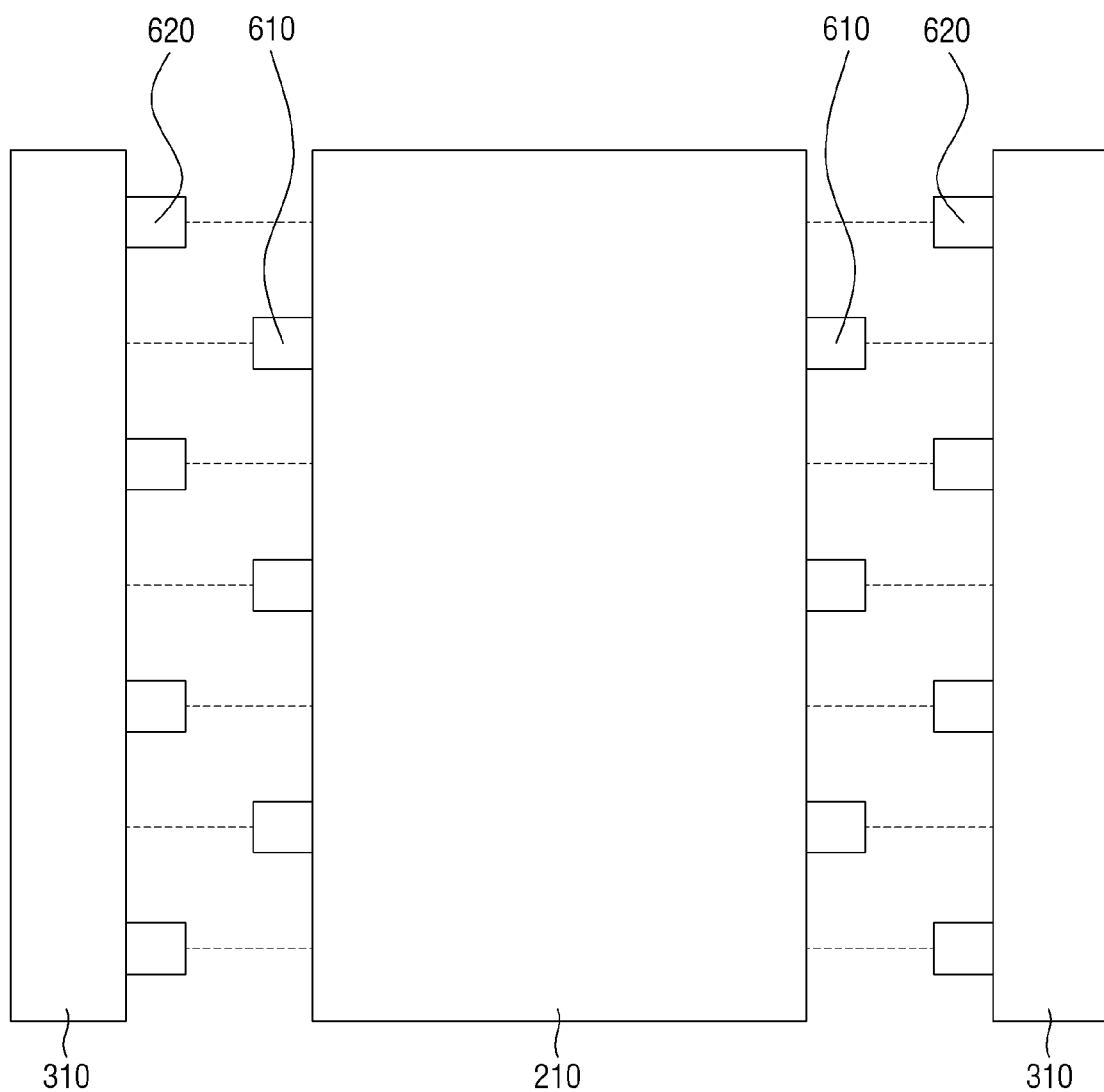

[FIG. 11]
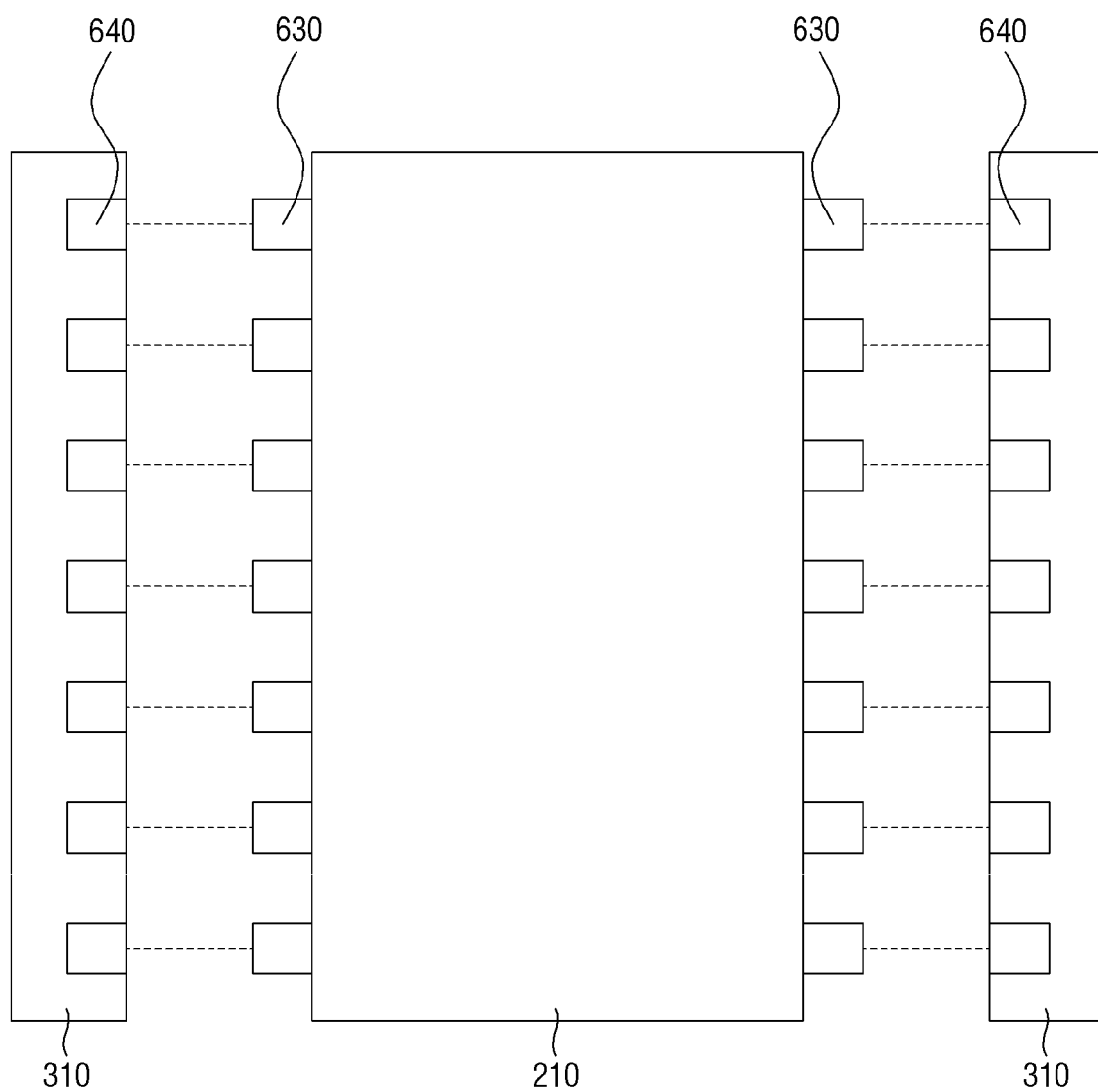

APPARATUS FOR TRANSPORTING SUBSTRATE AND SYSTEM FOR TREATING SUBSTRATE WITH THE APPARATUS

CROSS-REFERENCE TO RELATED APPLICATIONS

This is a U.S. Continuation of U.S. patent application Ser. No. 17/148,914, filed Jan. 14, 2021, which claims the benefit of Korean Patent Application No. 10-2020-0005548, filed on Jan. 15, 2020, which are hereby incorporated by reference in their entirety into this application.

BACKGROUND OF THE INVENTION

Field of the Invention

The present invention relates to a substrate transporting apparatus for transporting a substrate and a substrate treating system including the same. More specifically, it relates to a substrate transporting apparatus arranged between a plurality of process chambers and a substrate treating system including the same.

Description of the Related Art

A semiconductor device can be manufactured by forming a predetermined pattern on a substrate. When forming a predetermined pattern on a substrate, a number of processes such as a deposition process, a photo-lithography process, an etching process and a cleaning process may be continuously performed within a FAB.

A number of processes performed when manufacturing a semiconductor device may be done in individual chambers. In this case, the substrate may be transported to each chamber through a transporting robot.

SUMMARY OF THE INVENTION

The transporting robot may use a LM (Linear Motion) guide system when transporting a substrate (e.g., wafer). However, while the transporting robot moves on the LM rail to transport the substrate to the process chamber, heat generated by the driving of the motor may increase the temperature of the transporting robot.

Further, the transporting robot may be arranged between a plurality of process chambers to transport the substrate to each process chamber. Since the process chamber is in a high temperature state to perform a predetermined process, the temperature of the transporting robot may increase due to the process chamber.

When the surface temperature of the transporting robot is increased as described above, it may affect the driving performance of the transporting robot, such as abnormal motions of the transporting robot during the operation, and the lifespan of the transporting robot may be shortened.

The problem to be solved in the present invention is to provide a substrate transporting apparatus capable of preventing an increase in temperature of the transporting robot by installing a cooling plate around the transporting robot, and a substrate treating system including the same.

The problems of the present invention are not limited to the problems mentioned above, and other problems that are not mentioned will be clearly understood by those skilled in the art from the following description.

One aspect of the substrate transporting apparatus of the present invention for achieving the above object comprises a transporting unit for transporting a substrate; and a cooling plate for controlling a temperature of the transporting unit, wherein the cooling plate is spaced apart from a side surface of the transporting unit and installed as a side wall, or installed in close contact with a side surface of the transporting unit.

A flow path, through which coolant flows, may be installed inside the cooling plate.

The cooling plate may comprise a first plate member; a second plate member coupled to the first plate member; and a flow path formed in a space between the first plate member and the second plate member, through which coolant flows.

The flow path may be provided as a pipe inserted into a space between the first plate member and the second plate member, or a groove formed on at least one surface of at least one member of the first plate member and the second plate member.

When the groove is formed in the first plate member, the groove may be formed on a surface of the first plate member that contacts the second plate member when the first plate member and the second plate member are coupled.

When the groove is formed in the second plate member, the groove may be formed on a surface of the second plate member that contacts the first plate member when the first plate member and the second plate member are coupled.

At least one of a thermal compound, a thermal pad, and a thermal grease may be installed on the flow path.

The flow path may be formed in a zigzag shape.

The first plate member and/or the second plate member may be manufactured of a material emitting cool air to outside as a material.

The cooling plate may further comprise a pump for supplying coolant to the flow path; and a valve for controlling a flow of coolant by opening and closing the flow path.

The cooling plate may be further installed in a lower portion of the transporting unit.

When the cooling plate is installed in close contact with a side surface of the transporting unit, the cooling plate is installed using a combination of a first protrusion formed on the cooling plate and a second protrusion formed on the transporting unit, and the first protrusion and the second protrusion may have different heights.

When the cooling plate is installed in close contact with a side surface of the transporting unit, the cooling plate is installed using a combination of a protrusion formed on one of the cooling plate and the transporting unit, and a groove formed on the other, and the protrusion and the groove may have the same height.

The coolant may be PCW (Process Cooling Water).

The apparatus for transporting a substrate may further comprise a guide rail for providing a moving path of the transporting unit; and a support block coupled to an upper portion of the guide rail to support the transporting unit, and sliding along the guide rail.

Another aspect of the substrate transporting apparatus of the present invention for achieving the above object comprises a transporting unit for transporting a substrate; and a cooling plate for controlling a temperature of the transporting unit, wherein the cooling plate is spaced apart from a side surface of the transporting unit and installed as a side wall, or is installed in close contact with a side surface of the transporting unit, wherein a flow path, through which coolant flows, is installed inside the cooling plate, wherein at least one of a thermal compound, a thermal pad, and a thermal grease is installed on the flow path.

One aspect of the substrate treating system of the present invention for achieving the above object comprises a first process chamber for treating a substrate; a second process chamber for treating the substrate; and a substrate transporting device including a transporting unit for transporting the substrate between the first process chamber and the second process chamber, and a cooling plate for controlling a temperature of the transporting unit, wherein the cooling plate is spaced apart from a side surface of the transporting unit and installed as a side wall, or is installed in close contact with a side surface of the transporting unit.

Details of other embodiments are included in the detailed description and drawings.

BRIEF DESCRIPTION OF THE DRAWINGS

FIG. 1 is a plan view schematically showing an internal structure of a substrate treating system including a substrate transporting device.

FIG. 2 is a perspective view showing a detailed structure of the substrate transporting device shown in FIG. 1.

FIG. 3 is a plan view schematically showing a substrate transporting device including a cooling plate according to an embodiment of the present invention.

FIG. 4 is a cross-sectional view schematically showing a substrate transporting device including a cooling plate according to an embodiment of the present invention.

FIG. 5 is a perspective view showing a detailed structure of a cooling plate constituting a substrate transporting device according to an embodiment of the present invention.

FIG. 6 is a first exemplary view showing various installation types of pipe members constituting the cooling plate shown in FIG. 5.

FIG. 7 is a second exemplary view showing various installation types of pipe members constituting the cooling plate shown in FIG. 5.

FIG. 8 is a reference diagram for describing the performance of a substrate transporting device including a cooling plate according to an embodiment of the present invention.

FIG. 9 is a cross-sectional view schematically showing a substrate transporting devices including a cooling plate according to another embodiment of the present invention.

FIG. 10 is a first exemplary view for describing various types of coupling between a transporting unit and a cooling plate constituting a substrate transporting device according to an embodiment of the present invention.

FIG. 11 is a second exemplary view for describing various types of coupling between the transporting unit and the cooling plate constituting the substrate transporting device according to an embodiment of the present invention.

DETAILED DESCRIPTION OF THE INVENTION

Hereinafter, preferred embodiments of the present invention will be described in detail with reference to the accompanying drawings. Advantages and features of the present invention, and methods for achieving them will be clarified with reference to embodiments described below in detail together with the accompanying drawings. However, the present invention is not limited to the embodiments disclosed below, but may be implemented in various different forms, and only the embodiments allow the publication of the present invention to be complete, and are provided to fully inform those skilled in the technical field to which the present invention pertains of the scope of the invention, and the invention is only defined by the scope of the claims. The same reference numerals refer to the same components throughout the specification.

When elements or layers are referred to as "on" or "above" of other elements or layers, it includes not only when directly above of the other elements or layers, but also other layer or other element intervened in the middle. On the other hand, when elements are referred to as "directly on" or "directly above," it indicates that no other element or layer is intervened therebetween.

The spatially relative terms "below," "beneath," "lower," "above," "upper," etc., as shown in figures, can be used to easily describe the correlation of an element or components with other elements or components. The spatially relative terms should be understood as terms including the different direction of the element in use or operation in addition to the direction shown in the drawing. For example, if the element shown in the figure is turned over, an element described as "below" or "beneath" the other element may be placed "above" the other element. Accordingly, the exemplary term "below" can include both the directions of below and above. The element can also be oriented in other directions, so that spatially relative terms can be interpreted according to the orientation.

Although the first, second, etc. are used to describe various elements, components and/or sections, these elements, components and/or sections are not limited by these terms. These terms are only used to distinguish one element, component or section from another element, component or section. Therefore, the first element, first component or first section mentioned below may be a second element, second component or second section within the technical spirit of the present invention.

The terminology used herein is for describing the embodiments and is not intended to limit the present invention. In the present specification, the singular form also includes the plural form unless otherwise specified in the phrase. As used herein, "comprises" and/or "comprising" means that the components, steps, operations and/or elements mentioned above do not exclude the presence or additions of one or more other components, steps, operations and/or elements.

Unless otherwise defined, all terms (including technical and scientific terms) used in the present specification may be used as meanings commonly understood by those skilled in the art, to which the present invention pertains. In addition, terms defined in the commonly used dictionary are not ideally or excessively interpreted unless specifically defined.

Hereinafter, exemplary embodiments of the present invention will be described in detail with reference to the accompanying drawings, and in the description with reference to the accompanying drawings, the same or corresponding components are assigned the same reference numbers regardless of reference numerals, and the description overlapped therewith will be omitted.

When the temperature of a transporting robot that transports a substrate between a plurality of process chambers increases, the driving performance of the transporting robot may be deteriorated, and the lifespan of the transporting robot may be shortened.

Although the transporting robot may be cooled using airflow, since the substrate treating system including a plurality of process chambers and the transporting robot is operated in a vacuum state, a cooling method using airflow is difficult to apply.

In the present invention, a substrate treating system capable of preventing an increase in the temperature of the transporting robot (e.g., the surface temperature of the transporting robot, the internal temperature of the transporting robot, etc.) by installing a cooling plate around the transporting robot and a substrate transporting device included in such system are provided.

Hereinafter, the present invention will be described in detail with reference to the drawings.

FIG. 1 is a plan view schematically showing the internal structure of a substrate treating system including a substrate transporting device.

Referring to FIG. 1, a substrate treating system 100 may include an index module 110 and a process processing module 120.

The index module 110 and the process processing module 120 may be sequentially arranged in one direction. In the present embodiment, the direction, in which the index module 110 and the process processing module 120 are arranged, is defined as the first direction 10. Further, a direction perpendicular to the first direction 10 when viewed from above is defined as the second direction 20, and a direction perpendicular to the plane including the first direction 10 and the second direction 20 is defined as the third direction 30.

The index module 110 is arranged in front of the process processing module 120. The index module 110 may include a load port 111 and a transporting frame 112.

A carrier 130, in which the substrate is accommodated, is mounted on the load port 111. A plurality of such load ports 111 may be provided in front of the transporting frame 112, and a plurality of load ports 111 may be arranged in a row along the second direction 20.

In FIG. 1, it is shown that the index module 110 is provided with four load ports 111. However, this embodiment is not limited thereto. The number of load ports 111 may increase or decrease according to conditions such as process efficiency of the process processing module 120 and foot-print.

The carrier 130 accommodates a plurality of substrates (e.g., wafers). The carrier 130 may have a slot (not shown) provided therein to support the edge of the substrate.

A plurality of slots may be provided in the third direction 30. In this case, the substrates may be stacked in a state spaced apart from each other along the third direction 30 and positioned in the carrier 130. The carrier 130 may be implemented as, for example, a front opening unified pod (FOUP).

The transporting frame 112 transports the substrate between the carrier 130 mounted on the load port 111 and the buffer unit 121. The transporting frame 112 may include an index rail 113 and an index robot 114.

The index rail 113 provides a path through which the index robot 114 moves. The index rail 113 may be arranged such that its longitudinal direction is parallel to the second direction 20.

The index robot 114 directly transports the substrate. The index robot 114 may be installed on the index rail 113 and may linearly move along the second direction 20 on the index rail 113.

The index robot 114 may include a first base 114a, a first body 114b, and an index arm 114c. Here, the first base 114a may be installed to be movable along the index rail 113

The first body 114b may be coupled to the first base 114a. The first body 114b may be provided to be movable along the third direction 30 on the first base 114a. Further, the first body 114b may be provided to be rotatable on the first base 114a.

The index arm 114c is coupled to the first body 114b, and may be provided to be movable forward and backward with respect to the first body 114b. A plurality of such index arms 114c may be provided on the first body 114b to be individually driven.

The plurality of index arms 114c may be stacked and arranged to be spaced apart from each other along the third direction 30. Some of the plurality of index arms 114c may be used when transporting the substrate from the process processing module 120 to the carrier 130, and other parts may be used when transporting the substrate from the carrier 130 to the process processing module 120. When the plurality of index arms 114c are configured in this way, it is possible to obtain an effect of preventing particles generated from the substrate before process treating from adhering to the substrate after process treating in the process of the index robot 114 carrying in and out the substrate.

The process processing module 120 may include a buffer unit 121, a substrate transporting device 122, and a process chamber 123.

The buffer unit 121 provides a space, in which the substrate stays between the transporting frame 112 and the substrate transporting device 122 before the substrate is transported. The buffer unit 121 may be arranged between the transporting frame 112 and the substrate transporting device 122 for this purpose.

The buffer unit 121 may include a slot (not shown) therein, on which the substrate is mounted. A plurality of slots may be provided in the buffer unit 121, and a plurality of slots may be provided to be spaced apart from each other along the third direction 30. On the other hand, in the buffer unit 121, the surface facing the transporting frame 112, the surface facing the substrate transporting device 122, and the like may be opened respectively.

The substrate transporting device 122 transports a substrate between the buffer unit 121 and the process chamber 123. The substrate transporting device 122 may include a guide rail and a transporting unit. A more detailed description of the substrate transporting device 122 will be described later with reference to FIG. 2.

Meanwhile, the substrate transporting device 122 may transport a substrate between two different process chambers 123.

The substrate transporting device 122 may be arranged in that its longitudinal direction is parallel to the first direction 10. At this time, a plurality of process chambers 123 may be arranged on both sides of the substrate transporting device 122 along the second direction 20, and a plurality of process chambers 123 may be arranged on each side of the substrate transporting device 122 along the first direction 10.

The plurality of process chambers 123 may be arranged to be stacked with each other. That is, the plurality of process chambers 123 may be arranged in an X*Y arrangement on one side of the substrate transporting device 122. Here, X is a natural number of 1 or more, which means the number of process chambers 123 provided in a row along the first direction 10, and Y is a natural number of 1 or more, which means the number of process chambers 123 provided in a row along the third direction 30.

For example, when four process chambers 123 are provided on one side of the substrate transporting device 122, the four process chambers 123 may be arranged in 2*2 arrangement, and when six process chambers 123 are provided on one side of the substrate transporting device 122, the six process chambers 123 may be arranged in 3*2 arrangement.

Meanwhile, the number of process chambers 123 may increase or decrease. Further, the process chamber 123 may be provided only on one side of the substrate transporting device 122, or may be provided in a single layer on one or both sides of the substrate transporting device 122.

The process chamber 123 may be implemented as an etching chamber for etching a substrate in this embodiment. However, this embodiment is not limited thereto. The process chamber 123 may be implemented as a cleaning chamber for cleaning the substrate.

Next, the substrate transporting device 122 will be described. FIG. 2 is a perspective view showing a detailed structure of the substrate transporting device shown in FIG. 1.

According to FIG. 2, the substrate transporting device 122 may include a transporting unit 210, a guide rail 220, and a support block 230.

The substrate transporting device 122 transports a substrate W (e.g., wafer). The substrate transporting device 122 may transport a substrate between the buffer unit 121 and the process chamber 123, or between a first chamber, which is one of a plurality of process chambers 123 and a second chamber, which is another one.

Both the first chamber and the second chamber may be implemented as an etching chamber. However, this embodiment is not limited thereto. One of the first chamber and the second chamber may be implemented as an etching chamber, and the other may be implemented as a cleaning chamber.

The transporting unit 210 performs a linear motion between the buffer unit 121 and the process chamber 123 or between the first chamber and the second chamber to transport the substrate W. This transporting unit 210 may be implemented as a transporting robot.

The transporting unit 210 may be installed on the guide rail 220. The transporting unit 210 may perform linear motion along the first direction 10 on the guide rail 220 in a state, in which the substrate W is loaded.

The transporting unit 210 may include a second base 211, a second body 212, a driving member 213 and an arm member 214.

The second base 211 has a flat plate shape and may be installed in the lower portion of the transporting unit 210. The second base 211 may be installed to be movable in the first direction 10 along the guide rail 220.

The second base 211 may be installed on the support block 230. In this case, the second base 211 may have a tube therein to electrically connect the support block 230 and the motor.

The path provided inside the second base 211 may be formed of an electrically conductive material (e.g., a metal such as copper) as a material. However, this embodiment is not limited thereto. The second base 211 may have a transmission line installed therein to electrically connect the support block 230 and the motor.

The second base 211 may be installed on a plurality of support blocks 230 arranged at predetermined intervals. For example, the second base 211 may be installed on four support blocks 230 arranged at a predetermined interval in the first direction 10 and the second direction 20.

The second body 212 constitutes the body of the transporting unit 210 and may be installed by being coupled to the second base 211. The second body 212 may be installed to support the driving member 213 and the arm member 214.

The driving member 213 moves the arm member 214 to a predetermined position. The driving member 213 may be provided on the second body 212 so as to be rotatable in the second direction 20. Further, the driving member 213 may be provided on the second body 212 so as to be able to elevate in the third direction 30.

The arm member 214 loads the substrate W, and may unload the substrate W to a predetermined position under the control of the driving member 213.

A single arm member 214 may be installed on the driving member 213. In this case, the arm member 214 may be installed by being coupled to the upper plate of the driving member 213 in the lateral direction. However, this embodiment is not limited thereto. A plurality of arm members 214 may be installed on the driving member 213.

When a plurality of arm members 214 are installed on the driving member 213, the arm members 214 may be arranged in a vertical direction (i.e., the third direction 30) in a state spaced apart from each other on the side surface of the driving member 213. When a plurality of arm members 214 are installed on the driving member 213, it is also possible for the arm members 214 to be arranged in the left and right directions (i.e., the first direction 10 or the second direction 20) on the side surface of the driving member 213.

When a plurality of arm members 214 are installed on the driving member 213, some of the plurality of arm members 214 may be used when transporting a substrate from the buffer unit 121 to the process chamber 123, and other parts may be used when transporting the substrate from the process chamber 123 to the buffer unit 121.

The guide rail 220 is to provide a path, through which the transporting unit 210 moves. The guide rail 220 may be provided in that its longitudinal direction is the first direction 10, and may be installed as a pair of rails 221 and 222, that is, the first rail 221 and the second rail 222.

The support block 230 is coupled to the upper portion of the guide rail 220. The support block 230 may be installed so as to be slidable in the first direction 10 along the guide rail 220. The transporting unit 210 may be installed on the support block 230.

A plurality of support blocks 230 may be installed on the guide rail 220. In this case, a plurality of support blocks 230 may be installed on each of the first rail 221 and the second rail 222 constituting the guide rail 220.

When a plurality of support blocks 230 are installed on each of the first rail 221 and the second rail 222, the same number may be installed on each of the first rail 221 and the second rail 222. For example, two support blocks 230 may be installed on each of the first rail 221 and the second rail 222.

The support block 230 may include a first block 231, a second block 232, a third block 233, and a fourth block (not shown). The first block 231 and the second block 232 are installed on the first rail 221 and may be installed spaced apart in the first direction 10. The third block 233 and the fourth block are installed on the second rail 222 and may be installed spaced apart in the first direction 10 as in the case of the first block 231 and the second block 232.

The third block 233 may be formed at the position corresponding to the first block 231. That is, the third block 233 may be formed at the position parallel to the first block 231 in the second direction 20. Although not shown in FIG. 2, the second block 232 and the fourth block may also be formed in the same shape as the first block 231 and the third block 233.

In the above description, the substrate transporting device 122 is defined as transporting a substrate between the buffer unit 121 and the process chamber 123 (or between the first chamber and the second chamber). However, this embodiment is not limited thereto. The transporting frame 112 for transporting the substrate between the carrier 130 mounted on the load port 111 and the buffer unit 121 may also be implemented as a substrate transporting device.

The substrate transporting device 122 may include a cooling plate around the transporting unit 210 to control the temperature of the transporting unit 210. This will be described below.

FIG. 3 is a plan view schematically showing a substrate transporting device including a cooling plate according to an embodiment of the present invention, and FIG. 4 is a cross-sectional view schematically showing a substrate transporting device including a cooling plate according to an embodiment of the present invention.

According to FIGS. 3 and 4, the substrate transporting device 122 may be configured to include a transporting unit 210, a guide rail 220, a cooling plate 310, a pump 320, a cooling flow path 330, and a valve 340.

Since the transporting unit 210 and the guide rail 220 have been described above with reference to FIG. 2, detailed descriptions thereof will be omitted herein. Further, although not shown in FIGS. 3 and 4, the substrate transporting device 122 may be configured to include a support block 230.

The cooling plate 310 is for controlling the temperature of the transporting unit 210 (e.g., the surface temperature of the transporting unit 210, the internal temperature of the transporting unit 210, etc.). The cooling plate 310 has a cooling flow path 330 through which coolant can flow, and the temperature of the transporting unit 210 can be controlled through the coolant passing through the cooling flow path 330.

As shown in FIG. 5, the cooling plate 310 may include a first plate member 410, a pipe member 420, and a second plate member 430. FIG. 5 is a perspective view showing a detailed structure of a cooling plate constituting a substrate transporting device according to an embodiment of the present invention.

The body constitutes the body of the cooling plate 310. Such body may be formed by combining the first plate member 410 and the second plate member 430.

The first plate member 410 is arranged on one side surface of the pipe member 420. The first plate member 410 is formed to cover one side surface of the pipe member 420, and may be formed of an appropriate material and installed so as to discharge cold air emitted from the pipe member 420 to the outside.

The second plate member 430 is arranged on the other side surface of the pipe member 420. The second plate member 430 may be formed to cover the other side surface of the pipe member 420, and may be formed to seal the pipe member 420 by being combined with the first plate member 410. Like the first plate member 410, the second plate member 430 may be formed of an appropriate material and installed so as to discharge cool air emitted from the pipe member 420 to the outside.

The pipe member 420 provides a flow path through which coolant can flow. The pipe member 420 is arranged inside the cooling plate 310 and may be installed so that its outer shape is not exposed to the outside by the first plate member 410 and the second plate member 430.

The pipe member 420 may be installed in a zigzag shape from the top to the bottom direction (i.e., the negative third direction 30) as shown in FIG. 6 inside the cooling plate 310. However, this embodiment is not limited thereto. The pipe member 420 may be installed in a zigzag shape from one side to the other side direction (i.e., the first direction 10) as shown in FIG. 7. FIG. 6 is a first exemplary view showing various installation types of the pipe members constituting the cooling plate shown in FIG. 5, and FIG. 7 is a second exemplary view showing various installation types of the pipe members constituting the cooling plate shown in FIG. 5.

On the other hand, the cooling plate 310 does not have a separate pipe member 420, and may form a groove that can be used as a flow path through which coolant flows in at least one member of the first plate member 410 and the second plate member 430.

Meanwhile, in this embodiment, in order to increase the cooling efficiency of the cooling plate 310, a thermal compound may be applied to the surface of the pipe member 420 or a thermal pad may be mounted on the surface of the pipe member 420. Further, in the present embodiment, it is possible to apply thermal grease to the surface of the pipe member 420.

It will be described again with reference to FIG. 3.

The cooling plate 310 may be installed on the side surface of the transporting unit 210. The cooling plate 310 may be installed on both side surfaces of the transporting unit 210, and may be installed only on one side surface of the transporting unit 210.

When the cooling plate 310 is installed on the side surface of the transporting unit 210 in this way, although the high temperature heat energy 510 is discharged from the plurality of process chambers 123 arranged on both sides of the transporting unit 210 as shown in FIG. 8, it is possible to prevent the temperature of the transporting unit 210 from being increased by the cooling plate 310. FIG. 8 is a reference diagram for describing the performance of a substrate transporting device having a cooling plate according to an embodiment of the present invention.

Meanwhile, the cooling plate 310 may be installed not only at the side surface of the transporting unit 210 but also in the lower portion of the transporting unit 210 as shown in FIG. 9. FIG. 9 is a cross-sectional view schematically illustrating a substrate transporting device including a cooling plate according to another embodiment of the present invention.

It will be described again with reference to FIG. 3.

The pump 320 supplies coolant to the cooling flow path 330. The pump 320 may be installed outside the cooling plate 310 to supply coolant to the cooling flow path 330 (i.e., the pipe member 420) formed to extend into the cooling plate 310.

The cooling flow path 330 provides a path through which coolant may flow. This cooling flow path 330 is connected to the pump 320, and may be formed passing through the inside of the cooling plate 310 through an inlet portion 331 and an outlet portion 332 positioned inside the cooling plate 310. The coolant supplied by the pump 320 may be discharged to the outside by passing through the cooling flow path 330 installed inside the cooling plate 310 in the form of a pipe member 420. In this embodiment, PCW (Process Cooling Water) may be used as coolant.

The valve 340 controls the flow of coolant. The valve 340 is installed on the cooling flow path 330 to open and close the cooling flow path 330, thereby controlling the flow of coolant.

Meanwhile, in this embodiment, the cooling plate 310 is not limited to being installed spaced apart from the transporting unit 210 at a predetermined distance as shown in FIG. 3. For example, it is also possible for the cooling plate 310 to be installed being attached to the side surface of the transporting unit 210. When the cooling plate 310 is installed in close contact with the side surface of the transporting unit 210 as described above, an effect of improving the cooling efficiency by the cooling plate 310 can be obtained.

When the cooling plate 310 is formed in close contact with the side surface of the transporting unit 210, the cooling plate 310 may be coupled to the side surface of the transporting unit 210 by using the first protrusion 610 formed on the side surface of the transporting unit 210 and the second protrusion 620 formed on the side surface of the cooling plate 310, as shown in FIG. 10.

In this case, the second protrusion 620 may be formed on the side surface of the cooling plate 310 facing the side surface of the transporting unit 210, and may be formed at different heights to cross the first protrusion 610. FIG. 10 is a first exemplary view for describing various types of coupling between a transporting unit and a cooling plate constituting a substrate transporting device according to an embodiment of the present invention.

However, this embodiment is not limited thereto. When the cooling plate 310 is formed in close contact with the side surface of the transporting unit 210, it is also possible to couple the cooling plate 310 to the side surface of the transporting unit 210 using the third protrusion 630 formed on the side surface of the transporting unit 201 and the groove 640 formed on the side surface and the cooling plate 310 as shown in FIG. 11. In this case, the third protrusion 630 may be inserted into the groove 640 to couple the cooling plate 310 to the side surface of the transporting unit 210. FIG. 11 is a second exemplary view for describing various types of coupling between the transporting unit and the cooling plate constituting the substrate transporting device according to an embodiment of the present invention.

Meanwhile, although not shown, in this embodiment, the cooling plate 310 may be coupled to the side surface of the transporting unit 210 using a groove formed on the side surface of the transporting unit 210 and a fourth protrusion formed on the side surface of the cooling plate 310, and it is also possible to couple the cooling plate 310 to the side surface of the transporting unit through bolting, welding, or the like.

The substrate transporting device 122 according to various embodiments of the present invention has been described above with reference to FIGS. 3 to 11. The present invention relates to a method of improving the thermal efficiency of a cooling plate of Liner TM. The cooling plate 310 is mounted on the left/right side surface or the lower portion of the transporting unit 210, and a cooling effect due to heat generation of the transporting unit 210 using the phenomenon of thermal radiation can be obtained.

The cooling plate 310 may be mounted in the lower portion of the traveling shaft of the transporting unit 210, on the left/right side surface, or in both the lower portion/left side surface/right side surface depending on the situation, and the cooling plate 310 can function to suppress the increase of TM temperature by the process chamber 123.

The cooling plate 310 may be configured in a structure, in which coolant can flow therein. The cooling plate 310 may have a structure, in which coolant can flow using a separate pipe, or form a coolant path through a groove inside the plate.

Thermal efficiency is very important when coolant is injected into the cooling plate 310 using a pipe. To this end, a thermal compound may be applied to a cooling pipe formed inside the cooling plate 310 to improve thermal efficiency between the plate and the pipe. Alternatively, thermal efficiency can be improved by mounting a thermal PAD on the cooling pipe. Alternatively, thermal efficiency can be improved by applying thermal grease to the cooling pipe.

The present invention also proposes a method of mounting between the transporting unit 210 and the cooling plate 310 for efficient heat exchange.

The cooling plate 310 and the robot body of the transporting unit 210 may have a structure, in which the blades cross each other as shown in FIG. 10, in order to increase the heat exchange effect. The heat exchange effect can be maximized by maximizing the crossing area between the cooling plate 310 and the robot body of the transporting unit 210 through the wing structure.

The coolant in the cooling plate 310 may have a structure that is circulated as shown in FIGS. 6 and 7. PCW supplied from a semiconductor line may be used as coolant.

Although the embodiments of the present invention have been described with reference to the above and the accompanying drawings, those of ordinary skill in the art to which the present invention pertains can understand that the present invention can be implemented in other specific forms without changing the technical spirit or essential features. Therefore, it should be understood that the embodiments described above are illustrative and non-limiting in all respects.

What is claimed is:

1. A system for treating a substrate comprising:
   a substrate transporting apparatus operated in a vacuum state; and
   a plurality of process chambers disposed along a first direction and disposed on both sides of the substrate transporting apparatus along a second direction perpendicular to the first direction,
   wherein the substrate transporting apparatus comprises:
      a transporting robot loading a substrate into the plurality of process chambers or unloading the substrate from the plurality of process chambers, and linearly moving along the first direction;
      a guide rail provided as a moving path of the transporting robot and disposed parallel to the first direction; and
      a cooling plate installed as a side wall extending along the guide rail and a flow path, through which coolant flows, is installed inside the cooling plate.

2. The system for treating a substrate of claim 1, wherein the transporting robot comprises:
   a base installed to be movable along the guide rail;
   a driving member installed on the base and provided on the base so as to be able to elevate along a third direction perpendicular to a plane including the first direction and the second direction; and
   an arm member installed on the drive member and loading or unloading the substrate, and provided rotatably.

3. The system for treating a substrate of claim 2, wherein the cooling plate is installed as the side wall along the third direction in addition to the first direction to control the temperature of the transporting robot.

4. The system for treating a substrate of claim 3, wherein the guide rail includes a first rail and a second rail, and
   the cooling plate disposed in the substrate transporting apparatus so as to be adjacent to both the first rail and the second rail along the first direction.

5. The system for treating a substrate of claim 4, wherein the cooling plate comprises:
   a pipe member provided as the flow path, through which coolant flows; and a first plate member and a second plate member coupled to each other on both sides of the pipe member so that the pipe member can be embedded therein, and the first plate member, the second plate member, and the pipe member are formed separably.

6. The system for treating a substrate of claim 4, wherein the cooling plate comprises:

the flow path is provided as a groove formed on at least one surface of a first plate, a second plate, a first surface of a first plate member and a second surface of a second plate member facing the first surface.

7. The system for treating a substrate of claim 4, wherein the flow path is installed in a zigzag pattern inside the cooling plate.

8. The system for treating a substrate of claim 4, wherein at least one of a thermal compound, a thermal pad, and a thermal grease is installed on the flow path.

9. The system for treating a substrate of claim 4, wherein the substrate transporting apparatus comprises:

a pump for supplying coolant;

a cooling flow path provided as a passage through which the coolant flows, and connected to the flow path installed inside the pump and the cooling plate; and a valve installed on the cooling flow path and for opening and closing the cooling flow path.

10. The system for treating a substrate of claim 4, wherein the coolant is PCW.

\* \* \* \* \*